United States Patent [19]

Abe et al.

[11] Patent Number: 4,649,372
[45] Date of Patent: Mar. 10, 1987

[54] ANALOGUE TO DIGITAL CONVERTER

[75] Inventors: Miki Abe, Yokohama; Tadao Suzuki, Meguro, both of Japan

[73] Assignee: Sony Corporation, Tokyo, Japan

[21] Appl. No.: 556,710

[22] PCT Filed: Mar. 25, 1983

[86] PCT No.: PCT/JP83/00090
§ 371 Date: Nov. 25, 1983
§ 102(e) Date: Nov. 25, 1983

[87] PCT Pub. No.: WO83/03501
PCT Pub. Date: Oct. 13, 1983

[30] Foreign Application Priority Data

Mar. 25, 1982 [JP] Japan .................... 57-47607

[51] Int. Cl.$^4$ ........................... H03K 13/02
[52] U.S. Cl. ................. 340/347 NT; 340/347 AD; 324/99 D
[58] Field of Search .............. 340/347 NT, 347 AD; 324/99 D; 364/605, 829, 830; 328/127

[56] References Cited

U.S. PATENT DOCUMENTS

| | | | |
|---|---|---|---|
| 3,242,327 | 3/1966 | Burk et al. | 364/830 |
| 3,476,924 | 11/1969 | Conger | 364/830 |
| 3,749,894 | 7/1973 | Avdeef | 340/347 NT |
| 4,024,533 | 5/1977 | Neumann | 340/347 NT |
| 4,128,885 | 12/1978 | Valek et al. | 340/347 NT |
| 4,268,820 | 5/1981 | Hareyama | 324/99 D |
| 4,270,119 | 5/1981 | Mitamura | 340/347 NT |
| 4,342,983 | 8/1982 | Weigand et al. | 340/347 AD |
| 4,404,545 | 9/1983 | Nakanishi et al. | 340/347 AD |

Primary Examiner—William M. Shoop, Jr.
Assistant Examiner—Sharon D. Logan
Attorney, Agent, or Firm—Hill, Van Santen, Steadman & Simpson

[57] ABSTRACT

An analogue to digital converter comprises first and second switches (21:26) for sampling alternately first and second analogue signals, respectively, first and second integrators (22:27) which are supplied with the first and second analogue signals sampled alternately by the first and second switches (21:26), respectively, and produce output voltages varying in response to the first and second analogue signals supplied thereto, a constant current source section (32) operative to supply with a constant current to the first integrator (22) when the first switch (21) is in the OFF state and to the second integrator (27) when the second switch (26) is in the OFF state, and a digital signal generating section (34, 35) which is supplied alternately with comparison outputs obtained by comparing the output voltages of the first and second integrators derived therefrom when the constant current is supplied thereto with a predetermined voltage, respectively, and produces a digital signal corresponding to a duration defined by an instant at which the constant current source section commences supplying the constant current to either the first or second integrator and an instant at which the output voltage of either the first or second integrator, to which the constant current is supplied, reaches the level of the predetermined voltage.

4 Claims, 21 Drawing Figures

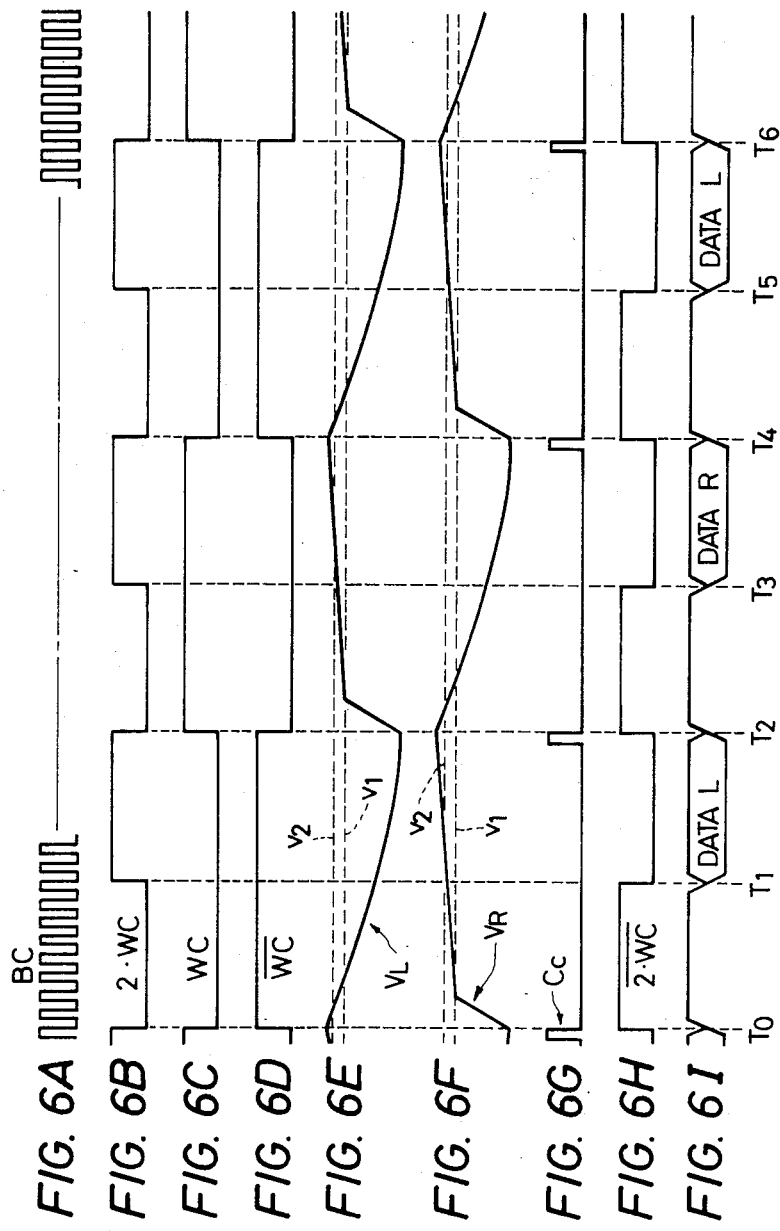

ANALOGUE TO DIGITAL CONVERTER

TECHNICAL FIELD

This invention relates to an analogue to digital converter for use in a PCM audio system and the like using a digital audio signal which is obtained by a pulse code modulation (PCM) technique.

TECHNICAL BACKGROUND

An analogue to digital converter of the counter type having characteristics high in accuracy has been frequenctly employed in audio systems such as a PCM audio system. Shown in FIG. 1 is a typical example of such a counter type analogue to digital converter. In FIG. 1, reference numeral 1 designates an integrator which is composed of an operational amplifier 1A and a capacitor 1B. An input terminal 3 is coupled through a sampling switch 2 to the input terminal of the integrator 1 together with a constant current source section 4. The sampling switch 2 is subjected to an ON-OFF control operation in response to a predetermined sampling pulse $P_s$ thereby to switch an input analogue signal applied to the input terminal 3. The integrator 1 is operative to carry out an integrating operation for the input analogue signal applied through the sampling switch 2. Further, both a constant current $I_0$ from a first constant current source 4A and a constant current $I_1$ from a second constant current source 4B are supplied to the integrator 1 through current switches 4C and 4D, respectively, to be integrated therein. The constant current sources 4A and 4B and the current switches 4C and 4D constitute the constant current source section 4. The constant currents $I_0$ and $I_1$ are determined to satisfy the relation of $(I_0+I_1)/I_1=2^7$ and $I_0=127 \cdot I_1$. The output terminal of the integrator 1 is coupled to the input terminal of a comparing section 5.

The comparing section 5 is composed of a first comparator 5A, a second comparator 5B and a reference voltage source 5C. The output voltage of the integrator 1 is supplied to both comparison input terminals of the first and second comparator 5A and 5B, respectively. The reference voltage of the reference voltage source 5C is supplied to a reference input terminal of the first comparator 5A whereas a reference input terminal of the second comparator 5B is grounded. The output terminals of the first and second comparators 5A and 5B are connected to both a control section 6 and a counter section 7.

The control section 6 is operative to produce the above-described sampling pulse $P_s$ to be supplied to a control terminal of the sampling switch 2. Further, the control section 6 is operative to produce a control signal $P_1$ to be supplied to control terminals of the first and second comparator 5A and 5B and to produce control signals $P_2$ and $P_3$ to be supplied to control terminals of the current switches 4C and 4D, respectively. A comparison output $C_1$ of the first comparator 5A and a comparison output $C_2$ of the second comparator 5B are supplied to the control section 6.

The counter section 7 includes a first counter 7A for higher bits and a second counter 7B for lower bits. A control signal $C_O$ is supplied from the control section 6 to a start terminal of the first counter 7A and the comparison output $C_1$ of the first comparator 5A is supplied to a stop terminal of the first counter 7A and a start terminal of the second counter 7B. Further, the comparison output $C_2$ is supplied to a stop terminal of the second counter 7B.

The operation of the analogue to digital converter described above will be explained hereinafter with reference to the accompanying FIG. 2.

Now, when the input analogue signal is applied to the input terminal 3, during a period of time $t_0$ to $t_1$ shown in FIGS. 2A to 2H, the sampling pulse $P_s$ takes a high level as shown in FIG. 2A and this results in that the sampling switch 2 is turned on. Accordingly, the integration is carried out in accordance with the input analogue signal in the integrator 1, so that an output voltage $V_0$ of the integrator 1 decreases as shown in FIG. 2B. This output voltage $V_0$ corresponds to the level of the input analog signal supplied to the input terminal 3 during the period of the time $t_0$ to $t_1$. When the sampling pulse $P_s$ falls down to a lower level at the time $t_1$, the sampling switch 2 is thus turned off. At this time, the control signal $P_1$ from the control section 6 rises up to a high level as shown in FIG. 2C so that both first and second comparators 5A and 5B in the comparing section 5 are turned into the active state. Simultaneously, the first counter 7A is supplied with the control signal $C_O$ as shown in FIG. 2F from the control section 6 thereby to commence the counting operation thereof. Further, upon falling down of the sampling pulse $P_s$, the control signals $P_2$ and $P_3$ both having a high level as shown in FIGS. 2D and 2E are supplied from the control section 6 to the current switches 4C and 4D so as to render the current switches 4C and 4D conductive. Consequently, the sum of the constant currents $I_0$ and $I_1$ is allowed to flow into the integrator 1 through the switches 4C and 4D and the integrator 1 carries out the integration in accordance therewith. This results in that the output voltage $V_0$ of the integrator 1 increases linearly. The output voltage $V_0$ is compared with the reference voltage $V_1$ supplied from the reference voltage source 5C in the first comparator 5A. Then, at the time $t_2$ when the output voltage $V_0$ exceeds the reference voltage $V_1$, the first comparator 5A operates to produce the comparison output $C_1$ as shown in FIG. 2G and the first counter 7A is stopped in response to the rising edge of the comparison output $C_1$ whereas the second counter 7B is caused to commence the counting operation thereof. Accordingly, the first counter 7A carries out the counting operation during the period of the time $t_1$ to $t_2$. Since the control signal $P_2$ falls to a low level when the output voltage $V_0$ is equal to the reference voltage $V_1$, the current switch 4A is turned off at the time $t_2$, and as a result of this, the constant current $I_1$ is only supplied from the second constant current source 4B to the integrator 1. Then, the integration is carried out in accordance with the constant current $I_1$ in the integrator 1, and the output voltage $V_0$ increases linearly again during the period of the time $t_2$ to $t_3$ and is compared with the reference voltage $V_2$ (0V in this embodiment) in the second comparator 5B. At the time $t_3$ when the output voltage $V_0$ becomes equal to the reference voltage $V_2$, the second comparator 5B generates the comparison output $C_2$ as shown in FIG. 2H. When the comparison output $C_2$ rises up to a high level, the second counter 7B is stopped. Accordingly, the second counter 7B carries out the counting operation during the period of the time $t_2$ to $t_3$. Thereafter, when the comparison output $C_2$ falls down to a low level and the rising edge of the subsequent sampling pulse $P_s$ appears at time $t_4$, the above-described operation is performed repeatedly.

The count result of the counter 7A at the time $t_2$ and the count result of the counter 7B at the time $t_3$ are latched and loaded to a shift register. Then, the results are derived in a serial mode, so that digital data consisting of higher bits and lower bits, which represent the integration output of the constant current $(I_0+I_1)$ and the integration output in response to the constant current $I_1$, respectively, can be obtained.

In case that, with such a conventional counter type analogue to digital converter described above, analogue to digital conversions with respect to a plurality of input analogue signals, for instance, a left-channel audio signal and a right channel audio signal contained in a stereophonic audio signal, are achieved, an analogue to digital converter as shown in FIG. 3, in which a pair of circuit blocks containing the integrator 1 to the counter section 7 as shown in FIG. 1 and an integrator 1' to a counter section 7' similar to those shown in FIG. 1, respectively, are provided and the left and right channel signals are applied to input terminals of the circuit blocks, respectively, has been employed. In the device of FIG. 3, a parallel/serial converter 8 such as a shift register is further provided to the output ends of the respective counter sections 7 and 7', so that digital data obtained by subjecting the right channel audio signal to the analogue to digital conversion and that obtained by processing the left channel audio signal similarly are produced alternately as serial data.

However, such a conventional device is required to have a couple of analogue to digital conversion circuit arrangements which are identical in circuit construction, and this results in the disadvantages that the device is intricate in circuit construction and the manufacturing cost thereof is increased.

In order to eliminate the drawbacks accompanying the above-described conventional device, an analogue to digital converter of a different type in which a single analogue to digital conversion circuit arrangement is provided and, as shown in FIG. 4, an input end of an integrator 1 therein is connected to both input terminal 11 and 11' through two sampling switches 10 and 10' which are turned on alternately by a control section 9, has been proposed. In such a device, the input terminals 11 and 11' are supplied with respectively left and right channel audio signals which are subjected alternately to an analogue to digital conversion through integrating operation and counting operation so as to produce digital data representing the both audio signals.

In this conventional device, excepting the sampling switches, the single analogue to digital conversion circuit arrangement is only required and therefore the circuit construction is made simple. However, since the single analogue to digital conversion circuit arrangement is used in common with respect to two input analogue signals alternately to produce outputs converted to digital signals, there is disadvantage that a relatively long time is required to achieve analogue to digital conversion for the two input analogue signals.

DISCLOSURE OF THE INVENTION

In view of the above, an object of the present invention is to provide an analogue to digital converter which is capable of carrying out analogue to digital conversion for two input analogue signals within a processing period substantially equal to that required for performing analogue to digital conversion for one input analogue signal with a single analogue to digital conversion circuit arrangement, and is not required to have two independent analogue to digital conversion circuit arrangements for the analogue to digital conversion for two input analogue signals.

According to an aspect of the present invention, there is provided an analogue to digital converter comprising first and second switches for sampling first and second analogue signals alternately, first and second integrators to which the first and second analogue signals sampled by the first and second switches alternately are supplied, respectively, a constant current source section operative to supply with a constant current to the first integrator when the first switch is in the OFF state and to the second integrator when the second switch is in the OFF state, and a digital signal generating section which is supplied alternately with comparison outputs obtained by comparing output voltages of the first and second integrators derived therefrom when the constant current is supplied thereto with a predetermined voltage, respectively, and operative to generate a digital signal corresponding to a duration defined by an instant at which the constant current source section commences supplying the constant current to either the first or second integrator and an instant at which the output voltage of either the first or second integrator to which the constant current is supplied becomes equal to the predetermined voltage.

In the analogue to digital converter thus constituted in accordance with the present invention, a sampling and integrating section is independently provided for each of two input analogue signals and comparison outputs which are obtained by comparing integration outputs from both the sampling and integrating sections with a predetermined voltage, respectively, are alternately supplied to a single digital signal generating section so that analogue to digital conversion in respect of one of the two input analogue signals is carried out during each period in which sampling and integrating operation in respect of the other of the two input analogue signals is performed. Accordingly, it is unnecessary for the device to have two independent analogue to digital conversion circuit arrangements for two input analogue signals, and this results in that the circuit configuration of the device is simplified and analogue to digital conversion in respect of two input analogue signals can be achieved within a period substantially equal to that required for analogue to digital conversion in respect of a single input analogue signal.

BRIEF DESCRIPTION OF THE DRAWINGS

In the accompanying drawings,

FIGS. 6A to 6I are waveform diagrams used for explaining the operation of the embodiment shown in FIG. 5.

EMBODIMENT MOST PREFERABLE FOR WORKING OF THE INVENTION

A preferred embodiment of the present invention will be described with reference to FIGS. 5 and 6 hereinafter.

Figure 5:
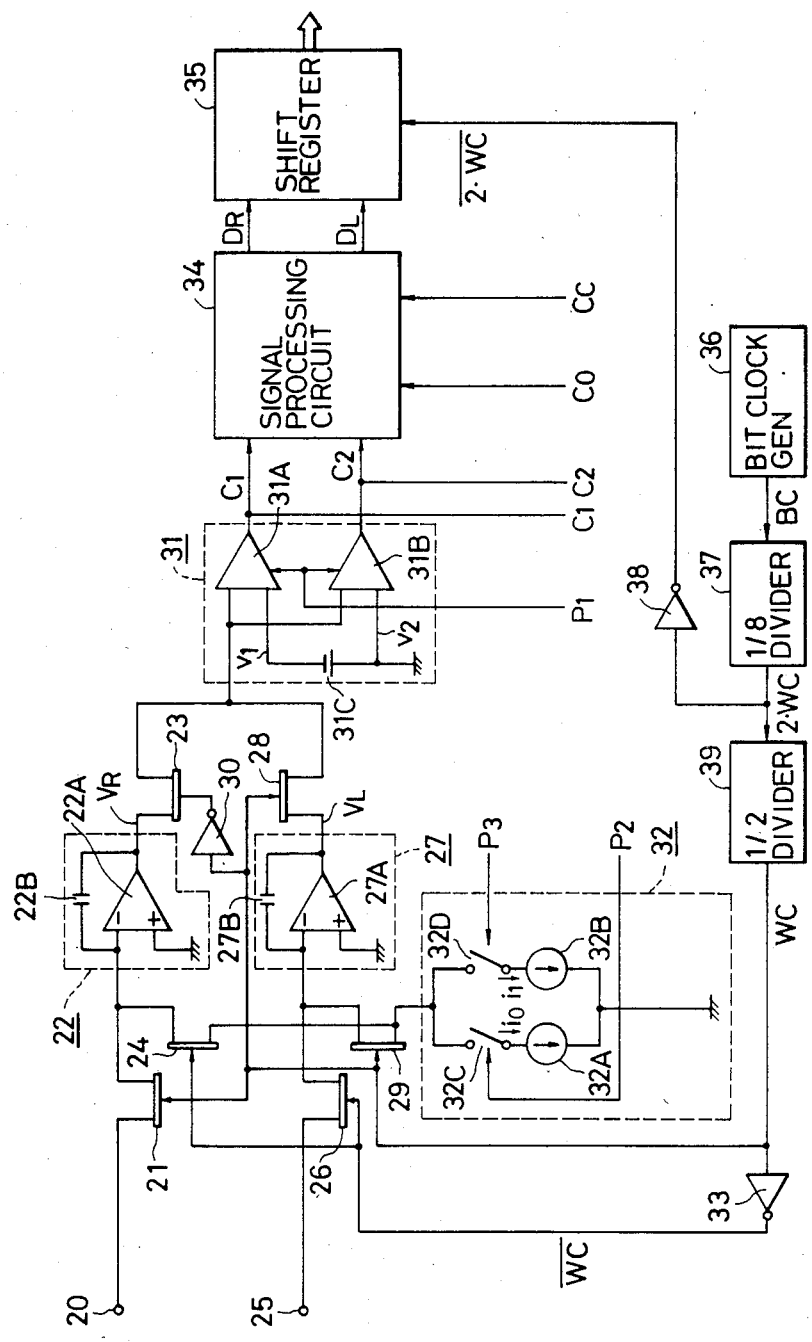
FIG. 5 is a block diagram showing a preferred embodiment of an analogue to digital converter according to the present invention.

FIG. 5 shows an example of an analogue to digital converter according to the present invention.

Initially, the circuit construction thereof will be described. In FIG. 5, reference numeral 20 denotes an input terminal to which a first analogue signal is delivered. The input terminal 20 is connected through a switch 21 formed with a field effect transistor (hereinafter referred to merely as FET) to the input terminal of a first integrator 22. The output terminal of the first integrator 22 is connected to a terminal provided at the input side of a switch 23 formed with an FET. Reference numeral 25 denotes an input terminal to which a second analog signal is delivered. The input terminal 25 is connected through a switch 26 formed with an FET to the input terminal of a second integrator 27. The output terminal of the second integrator 27 is connected to a terminal provided at the input side of a switch 28 formed with an FET. A junction between the switch 21 and the input terminal of the first integrator 22 and a junction between the switch 26 and the input terminal of the second integrator 27 are respectively coupled through switches 24 and 29 formed with FETs to an current output terminal of a constant current source section 32 which is similar to the constant current source section 4 shown in FIG. 1. The constant current source section 32 includes first and second current sources 32A and 32B and current switches 32C and 32D. Further, an inverter 30 is provided between the control terminals of the switches 23 and 28.

Figure 1:
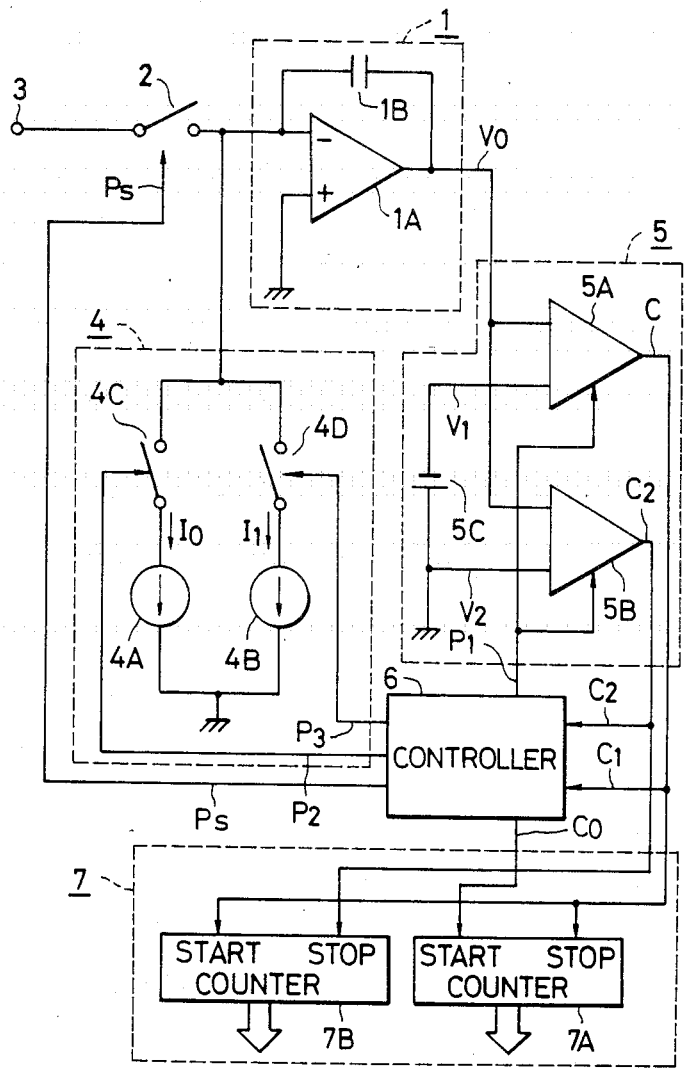
FIG. 1 is a block diagram showing an example of a conventional counter type analogue to digital converter.
Figure 2:
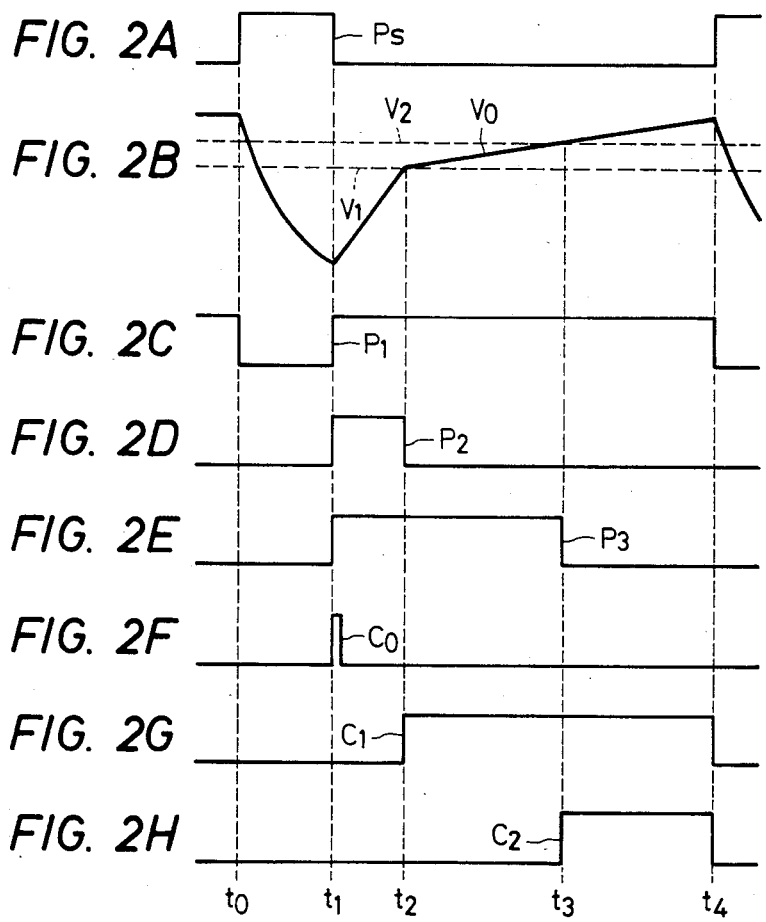
FIGS. 2A to 2H are waveform diagrams used for explaining the operation of the example of FIG. 1.
Figure 3:
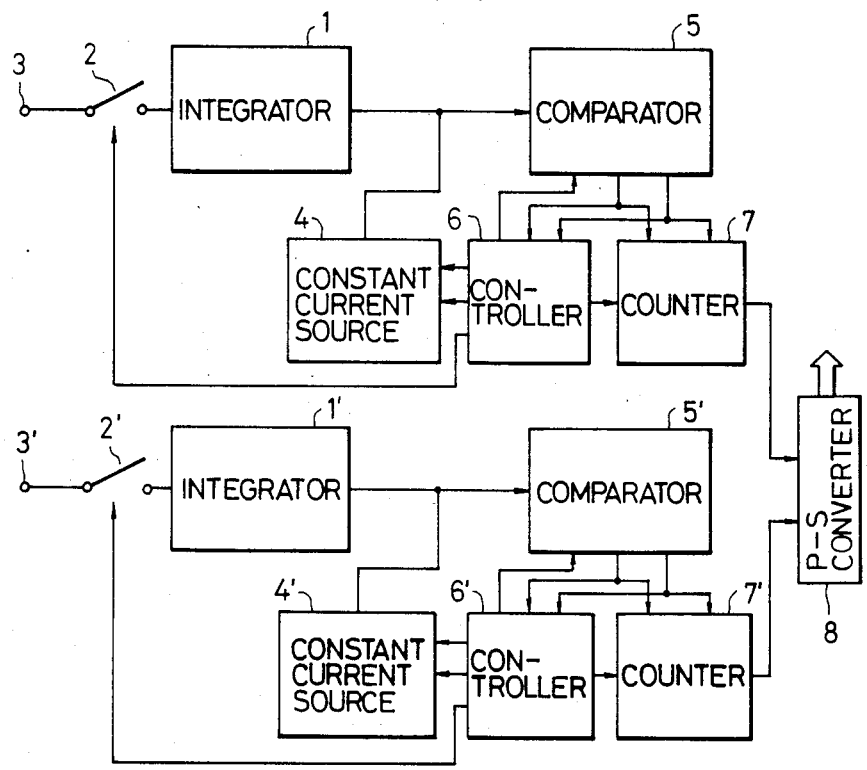
FIGS. 3 and 4 are block diagrams each showing an example of a conventional analogue to digital converter used for analogue to digital conversion in respect of two input analogue signals.
Figure 4:
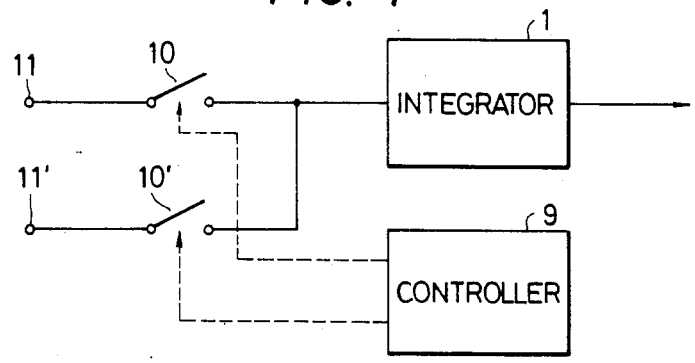

The output terminals of the switches 23 and 28 are connected in common, and the common connecting point thereof is connected to a comparing section 31 which is similar to the comparing section 5 shown in FIG. 1. The two output terminals of the comparing section 31, that is, the output terminal from which a comparison output $C_1$ from a first comparator 31A is obtained and the output terminal from which a comparison output $C_2$ from a second comparator 31B is obtained, are connected to the input terminals of a signal processing circuit 34. The signal processing circuit 34 includes a first counter for higher bits, a second counter for lower bits and latch circuits provided to each of the first and second counters. Further, the output terminal of the signal processing circuit 34 is connected to a shift register 35.

The control terminals of the switches 21, 28 and 29 and the input terminal of the inverter 30 are connected in common and the common junction thereamong is connected to the input terminal of an inverter 33. The output terminal of the inverter 33 is connected to both control terminals of the switches 24 and 26.

The output terminal of a bit-clock generating circuit 36 is connected to the input terminal of a ½ frequency divider 37, the output terminal of which is connected through an inverter 38 to a shift clock supply terminal of the shift register 35. The output terminal of the ½ frequency devider 37 is further connected through a ½ frequency divider 39 to the input terminal of the inverter 33.

The operation of the analogue to digital converter constructed in such a manner as described above will be described with reference to the waveform diagrams of FIGS. 6A to 6I.

A bit clock signal BC as shown in FIG. 6A, which is generated by the bit clock generating circuit 36, is subjected to ½ frequency division in the ½ frequency divider 37 so that a double-frequency word clock signal 2·WC as shown in FIG. 6B is obtained. The signal 2·WC is then subjected to ½ frequency division in the ½ frequency divider 39 so as to produce a word clock signal WC as shown in FIG. 6C. Thereafter, the signal WC is inverted by the inverter 33 and, as a result of this, a word clock signal $\overline{WC}$ as shown in FIG. 6D is obtained.

When the first analogue signal is delivered to the input terminal 20 and the second analogue signal is delivered to the input terminal 25, the word clock signal WC takes a low level and the word clock signal $\overline{WC}$ takes a high level during a period of time $T_0$ to $T_2$. Accordingly, the switches 26, 24 and 23 are rendered nonconductive whereas the switches 21, 29 and 28 are rendered conductive. As a result, the second analogue signal delivered to the input terminal 25 is supplied to the input terminal of the second integrator 27 through the switch 26. In the second integrator 27, integration in accordance with the second analogue signal is carried out, and an output voltage $V_L$ of the second integrator 27 decreases gradually as shown in FIG. 6E. This output voltage $V_L$ corresponds to the level of the second analogue signal delivered to the input terminal 25 during the period of the time $T_0$ to $T_2$.

The first analogue signal delivered to the input terminal 20 has been supplied through the switch 21 rendered conductive to the first integrator 22 before the time $T_0$ and integration in accordance therewith has been carried out in the first integrator 22 so as to produce an output voltage $V_R$ thereof. The output voltage $V_R$ is then supplied through the switch 23 to the input terminal of the comparing section 31. Simultaneously, due to the application of such control signals $P_2$ and $P_3$ as used in the case described above with reference to FIG. 1 and FIGS. 2A to 2H, both the switches 32C and 32D are simultaneously turned on at the time $T_0$ and a sum of constant currents $i_0$ and $i_1$ supplied from the constant current sources 32A and 32B, respectively, is allowed to flow into the first integrator 22. As a result, the output voltage $V_R$ of the first integrator 22 increases linearly as shown in FIG. 6F. At the time $T_0$, a control signal $C_c$ falls down to a low level and the first counter contained in the signal processing circuit 34 is caused to start counting. At this time, since such a control signal $P_1$ as used in the case described with reference to FIG. 1 and FIGS. 2A to 2H is supplied to the comparing section 31 with the high level, the comparing section 31 is in the operative state. The level of the output voltage $V_R$ is compared with the reference voltage $v_1$ from the reference voltage source 31C at the first comparator 31A. When the levels of both voltages compared in the first comparator 31C coincide with each other, the comparison output $C_1$ is supplied to the signal processing circuit 34, so that the first counter which has been caused to start counting in response to the falling edge of the control signal $C_c$ shown in FIG. 6G, is stopped counting and the second counter is caused to start counting. Simultaneously, the control signal $P_2$ falls down to the low level thereby to turn the current switch 32C off. As a result, the constant current $i_0$ from the constant current source 32A is interrupted to be supplied to the first integrator 22 and the constant current $i_1$ from the second constant current source 32B is only supplied to the integrator 22. Due to the supply of the constant current $i_1$ from the second constant current source 32B, the output voltage $V_R$ further increases linearly. The output voltage $V_R$ is compared with the reference voltage $v_2(0\ V)$ in the comparing section 31 at the second comparator 31B. When the output voltage $V_R$ and the reference voltage $v_2$ coincide with each other, the comparison output $C_2$ is supplied from the second comparator 31B to the signal processing circuit 34 thereby to cause the second counter contained therein to stop counting. It should be noted that the contents of the first and second counters are latched by the latch circuit in the signal processing circuit 34 at the rising edge of the control signal $C_c$ and the first counter is reset and then caused to start counting upon the falling edge of the control signal $C_c$.

Data $D_L$ obtained from both the first and second counters and representative of the second analogue signal, which have been latched in the signal processing circuit 34 before the time $T_0$, are loaded to the shift register 35 during the period of the time $T_0$ to $T_1$ within a period of the time $T_0$ to $T_2$, in which the double-frequency word clock signal $2 \cdot WC$ takes a high level as shown in FIG. 6H. Further, during a period of the time $T_1$ to $T_2$ in which the signal $\overline{2 \cdot WC}$ takes a low level, the data thus stored in the shift register 35 are then derived in serial mode to produce a digital conversion output DATA L in respect of the second analogue signal as shown in FIG. 6I.

Then, during a period of the time $T_2$ to $T_4$, the word clock signals WC and $\overline{WC}$ are put in the reversed state with respect to that during the period of the time $T_0$ to $T_2$. Accordingly, the switches 26, 24 and 23 are turned off, while the switches 21, 29 and 28 are turned on. Consequently, the output voltage $V_L$ obtained as a result of the integration carried out in the second integrator 27 during the period of the time $T_0$ to $T_2$ is supplied through the switch 28 to the input terminal of the comparing section 31. Simultaneously, as is similar to the case during the period of the time $T_0$ to $T_2$ described above, the supply of the constant current from the constant current source section 32 to the second integrator 27 is initiated in response to the control signals $P_2$ and $P_3$ at the time $T_2$. Then, the counting and latching operations of the first and second counters in respect of the second analogue signal are carried out in the signal processing circuit 34.

Data $D_R$ obtained from both the first and second counters and representative of the first analogue signal in the period of time $T_0$ to $T_2$, which have been latched in the signal processing circuit 34 before the time $T_2$, are loaded to the shift register 35 during the period of the time $T_2$ to $T_3$ within a period of time $T_2$ to $T_4$, in which the double-frequency word clock signal $2 \cdot WC$ takes the high level. Further, during a period of the time $T_3$ to $T_4$ in which the signal $\overline{2 \cdot WC}$ takes the low level, the data thus stored in the shift register 35 are then derived in serial mode to produce a digital conversion output DATA R in respect of the first analogue signal as shown in FIG. 6I.

After the time $T_4$, the above-described operation during the period of the time $T_0$ to $T_4$ is repeatedly carried out.

In summary, during the period in which the word clock signal WC takes the lower level, the sampling operation in respect of the second analogue signal is performed and further higher bit data and lower bit data in respect of the first analogue signal are obtained to be latched. On the other hand, during the period in which the word clock signal WC takes the higher level, the sampling operation in respect of the first analogue signal is performed, and further higher bit data and lower bit data in respect of the second analogue signal are obtained to be latched. As a result, the digital conversion output which is composed of the higher bit data and the lower bit data representing the second analogue signal is obtained during the period in which the word clock signal WC takes the lower level. In contrast, during the period in which the word clock signal WC takes the higher level, the digital conversion output which is composed of the higher bit data and the lower bit data representing the first analogue signal is obtained.

In the above described embodiment, although the output voltages from the first and second integrators are alternately subjected to comparison with a predetermined certain voltage and the resultant comparison outputs are supplied to the common comparing section whose comparison output is supplied to the signal processing circuit including the counters and the latch circuits, it is possible to have such modifications that two comparing sections are respectively provided to the output sides of the first and second integrators to compare the outputs of the integrators with predetermined voltage values independently, and the comparison results from the two comparing sections are alternately supplied to the signal processing circuit including the counters and the latch circuits.

Furthermore, the timing at which the latched data of first and second counters are loaded to the shift register and then derived therefrom, and the duration of the above data processing may be selectively determined according to requirements within a half period of the word clock signal.

As described above, in an analogue to digital converter according to the present invention, sampling and integrating sections are independently provided in respect of respective two input analogue signals, and futher signal outputs representative of integration outputs from the sampling and integrating sections are alternately supplied to a common digital conversion output supplying section so that sampling and integrating operation in respect of one of input analogue signal is carried out during each period in which analogue to digital conversion in respect of the other of the input analogue signal is performed.

APPLICABILITY FOR INDUSTRIAL USE

An analogue to digital converter according to the present invention is advantageous in that analogue to digital conversion in respect of two input analogue signals is carried out accurately and therefore is suitable, for example, to be used to form an analogue to digital conversion section for recording PCM audio signals in PCM audio disk systems or PCM audio tape systems, in which analogue audio signals of left and right channels are respectively converted to PCM digital audio signals to be recorded onto either a disk medium or a magnetic tape medium.

We claim:

1. An analogue to digital converter comprising:
   first and second switching means for sampling alternately first and second analogue signals presented to first and second input terminals, respectively,
   first and second integrators connected to first and second switching means for continuously receiving one or the other of said analogue signals, said first and second integrators being alternately operative to receive the analogue signal which is being sampled, constant current generating means, third switch means, connected to said constant current generating means and to said first and second integrators for supplying a constant current continuously to one or the other of said first and second integrators, and alternately to said first and second integrators, a comparator means for comparing output voltages of said first and second integrators with a reference potential, digital signal generator means connected with said comparator means and responsive thereto for generating a digital signal corresponding to each period beginning when said constant current generator means commences supplying constant current to either one of said first and second integrators and ending at the instant at which the output voltage of said one of first and second integrators reaches the level of said predetermined voltage, and switch control means connected to said third switching means for controlling the same to contact said constant current generating means alternately to said first and second integrators during each period in which an input analogue signal is supplied to the other one of said first and second integrators.

2. An analogue to digital converter according to claim 1 wherein said digital signal generating means comprises a signal processing circuit, said signal processing circuit comprising counter means controlled by the output of said comparator and operative to count during said period, latch circuit means connected with said counter means for causing said counter means to be latched against further counting, and a shift register connected to said counter means for converting the output therefrom from parallel to serial form.

3. An analogue to digital converter according to claim 2 wherein said comparator means has a first input connected in common to said first and second integrators and a second input connected to a reference voltage, and an output connected to said digital signal generating means, whereby an output is supplied to said digital signal generating means in response to the comparison of said first and second inputs.

4. An analogue to digital converter according to claim 1 wherein said first and second switching means each comprise a field effect transistor.

* * * * *